(12) United States Patent
Kato et al.

(10) Patent No.: US 7,990,674 B2
(45) Date of Patent: Aug. 2, 2011

(54) LOAD DRIVE APPARATUS

(75) Inventors: Yuji Kato, Saitama (JP); Keiichi Sekiguchi, Saitama (JP); Kiyokatsu Satoh, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 278 days.

(21) Appl. No.: 12/307,321

(22) PCT Filed: Jun. 21, 2007

(86) PCT No.: PCT/JP2007/062487
§ 371 (c)(1),
(2), (4) Date: Jan. 2, 2009

(87) PCT Pub. No.: WO2008/004446
PCT Pub. Date: Jan. 10, 2008

(65) Prior Publication Data
US 2009/0237853 A1    Sep. 24, 2009

(30) Foreign Application Priority Data
Jul. 5, 2006  (JP) ................................. 2006-185885

(51) Int. Cl.
*H02H 5/04* (2006.01)
(52) U.S. Cl. ...................................... 361/103
(58) Field of Classification Search .................. 361/247, 361/103
See application file for complete search history.

(56) References Cited

U.S. PATENT DOCUMENTS
5,981,918 A    11/1999   Topp et al.
(Continued)

FOREIGN PATENT DOCUMENTS
JP           7030390          1/1995
(Continued)

OTHER PUBLICATIONS

Kajiwara T et al: "New intelligent power multi-chips modules with junction temperature detecting function" Industry Applications Conference, 1998, 33rd IAS Annual Meeting, the 1998 IEEE St. Louis, MO, USA Oct. 12-15, 1998, NewYork, NY USA, IEEE, U.S., vol. 2, Oct. 12, 1998, pp. 1085-1090, XP010313040, ISBN: 978-0-7803-4943-8.
European Search Report for EP 07767314.3, dated Jul. 10, 2009.

*Primary Examiner* — Jared J Fureman
*Assistant Examiner* — Angela Brooks
(74) *Attorney, Agent, or Firm* — Bachman & LaPointe, P.C.

(57) ABSTRACT

A load drive apparatus is provided which comprises a switching element 3 connected in series to a DC power source $V_{cc}$ and an electric load 4, a drive circuit 5 for generating control signals to turn switching element 3 on and off, a thermal detection element 6 for sensing a temperature of switching element 3, an overheat protective circuit 7 for generating an overheat detection signal when thermal detection element 6 senses the temperature of switching element 3 over a predetermined temperature level, and a disconnection detection circuit 11 provided with a current mirror circuit 12 connected between one and the other terminals of thermal detection element 6 for detecting a disconnection in wiring between thermal detection element 6 and overheat protective circuit 7. When overheat protective circuit 7 produces an overheat detection signal or when disconnection detection circuit 11 detects a breaking of wiring between thermal detection element 6 and overheat protective circuit 7, the control signal from drive circuit 5 is prohibited to be given to switching element 3. In case of disconnection in wiring between the thermal detection element 6 and overheat protective circuit 7, the load drive apparatus can prevent thermal damage to the switching element used therein.

5 Claims, 1 Drawing Sheet

U.S. PATENT DOCUMENTS

| | | |
|---|---|---|
| 6,266,221 B1 | 7/2001 | Scilla |
| 2003/0067340 A1 | 4/2003 | Watanabe |
| 2005/0099751 A1 | 5/2005 | Kumagai |

FOREIGN PATENT DOCUMENTS

| | | |
|---|---|---|
| JP | 2000299631 | 10/2000 |
| JP | 2006013022 | 1/2006 |
| JP | 2006063826 | 3/2006 |

US 7,990,674 B2

LOAD DRIVE APPARATUS

TECHNICAL FIELD IN INDUSTRY

This invention relates to a load drive apparatus which comprises a switching element for supplying electric power to an electric load and can stop operation of the switching element when a thermal detection element provided appreciates an overheating of the switching element or when electric disconnection to the thermal sensing element is detected to prevent overheating.

PRIOR ART

For example, FIG. 2 shows a prior art load drive circuit for supplying a large electric current over 10 A to an electric load such as a vehicle lamp, however, such a circuit has a problem as to how to control heat generated from a driving MOS-FET 3 as a switching element. The load drive circuit shown in FIG. 2 comprises a control device 2 and a drive device 1 connected to control device 2 for supplying electric power to electric load 4. Drive device 1 comprises driving MOS-FET 3 for supplying electric power to electric load 4 and a thermal detection element 6 for sensing a temperature of driving MOS-FET 3 to produce an output signal corresponding to driving MOS-FET 3's temperature. Control circuit 2 comprises a drive circuit 5 for turning driving MOS-FET 3 on and off, and an overheat protective circuit 7 for receiving an output signal from thermal detection element 6. Temperature of driving MOS-FET 3 can generally be measured by thermal detection element 6 which is a temperature-dependent diode or transistor, utilizing the temperature-dependent forward voltage of diode, base-emitter voltage of transistor or gate-source voltage of FET due to change in impedance thereof with change in ambient temperature. Drive circuit 5 provides drive signals to a gate terminal in driving MOS-FET 3 to alternatively turn it on and off so that driving MOS-FET 3 supplies electric current from a DC power source $V_{cc}$ to load 4 during turning-on of driving MOS-FET 3. In case of any abnormal condition such as a short circuit accident in load 4, overcurrent may run through driving MOS-FET 3 which is therefore heated above a critical temperature in a range possibly causing thermal damage to driving MOS-FET 3. To prevent such a thermal damage, thermal detection element 6 always monitors temperature of driving MOS-FET 3 to produce, to overheat protective circuit 7, output signals representative of temperature in driving MOS-FET 3. When MOS-FET 3 is heated to a given threshold level of temperature, overheat protective circuit 7 produces an overheat detection signal to stop operation of drive circuit 5 and simultaneously turn driving MOS-FET 3 off to cease electric supply to load 4.

In this case, there would be a need of measuring temperature of driving MOS-FET 3 with accuracy by mounting thermal detection element 6 directly on drive device 1 in which driving MOS-FET 3 is built while electrically connecting thermal detection element 6 and overheat protective circuit 7 via wires. For example, Patent Document 1 as listed below, discloses a semiconductor device capable of exactly detecting an overheated condition of a semiconductor chip by sensing a temperature closer to a central portion of semiconductor chip by means of a thermal detection element integrated together around semiconductor chip. This semiconductor device comprises a semiconducting chip, a thermal detection element disposed on one end of the semiconducting chip for unitary integration therewith, and first and second metallic wires extending in the X-direction and having a plurality of wire-bonded points. The semiconductor device is required to dispose the first metallic wire closer to the thermal detection element in the Y-direction than the second metallic wire such that a first distance in the X-direction from a first edge of the semiconducting chip to the nearest wire-bonded points of the first metallic wire is shorter than a second distance in the X-direction from the first edge of the semiconducting chip to the nearest wire-bonded points of the second metallic wire. Thus, the thermal detection element is deployed around the semiconducting chip to dispose wire-bonded points of adjacent metallic wires at locations closer to the thermal detection element, and therefore, the semiconductor device can detect an overheated condition of semiconducting chip with high precision because the thermal detection element mounted around the semiconducting chip can detect a temperature closer to a central portion of the semiconducting chip. Although the semiconductor device can curb heat generation from semiconducting chip, a directive semiconductor device for controlling the semiconducting chip has to be mounted away from an output semiconductor device equipped with the semiconducting chip.

Problem to be Solved by Invention

The circuit shown in FIG. 2 is imperfect because driving MOS-FET 3 may be subject to thermal damage due to malfunction of overheat protective circuit 7 since operation temperature of drive device 1 is elevated to an abnormal level when electric disconnection occurs between thermal detection element 6 and overheat protective circuit 7 for any cause such as impact, vibration or electrically defective connection. In addition, a similar disadvantage would occur when assemblage of driving MOS-FET 3 and control device 2 into a package may cause electrical disconnection in wiring. In that case, Patent Document 2 as listed below deals with a problem of electric disconnection between thermal detection element 6 and overheat protective circuit 7. Specifically, Patent Document 2 demonstrates a semiconductor device which comprises a plurality of switching power semiconducting elements which form an inverter bridge circuit, an overheat protective circuit for appreciating each overheat of switching power semiconductor elements responsive to change in inherent negative resistance value of a thermal sensor, a failure detection circuit for monitoring a rapid increase in a resistance value of the circuit inclusive of the thermal sensor to pick up an abnormal condition of the thermal sensor and produce a failure output, and a protective circuit for receiving overheat and failure output signals from the overheat detection circuit and failure detection circuit to generate an overheat protection signal for switching power semiconductor elements, an alarm signal thereof and a failure alarm signal for thermal sensor. Overheat detection circuit comprises a resistance bridge circuit and a first comparator connected to the resistance bridge circuit which has a first resistive arm provided with a thermal sensor and a second resistive arm. Failure detection circuit comprises a third resistive arm connected in parallel to resistance bridge circuit in overheat detection circuit, and a second comparator connected to each intermediate tap of first and third resistive arms for detecting an imbaranced voltage between these resistive arms. Second comparator has a non-inverted input terminal connected to an intermediate tap of first resistive arm in which thermal sensor is connected, and an inverted input terminal connected to an intermediate tap of third resistive arm. In this arrangement, when any abnormal accident such as disconnection occurs in the circuit equipped with the thermal sensor, second comparator produces an alarm signal. Also, overheat detection circuit monitors change in resistance value of thermal sensor to perceive overheat in switching power semiconductor elements, and failure detection circuit monitors rapid increase in resistance value in thermal sensor to observe the abnormal condition in overheat detection circuit so that in case of overheating and short-circuit accident, the protective circuit receives overheat and failure output signals from overheat detection circuit and failure detection circuit to generate overheat protection and alarm signals to prevent breakdown of switching power semiconducting elements. Overheat protection circuit shown in Patent Document 2 is deficient because it is difficult to form the overheat detection circuit into a small integrated circuit since resistance bridge circuit needs to have thermal sensor of negative resistance characteristics to detect resistance change in thermal sensor.

[Patent Document 1] Japanese Patent Disclosure No. 2006-13022

[Patent Document 2] Japanese Patent Disclosure No 7-30390

Accordingly, an object of the present invention is to provide a load drive apparatus capable of preventing a switching element from receiving thermal damage in case of breaking of wiring between a thermal detection element and overheat protective circuit.

Means for Solving the Problem

The load drive apparatus according to the present invention comprises a switching element (3) connected in series to a DC power source ($V_{cc}$) and an electric load (4), a drive circuit (5) for generating control signals to turn switching element (3) on and off, a thermal detection element (6) for sensing a temperature of switching element (3), an overheat protective circuit (7) for generating an overheat detection signal when thermal detection element (6) senses the temperature of switching element (3) over a predetermined temperature level, and a disconnection detection circuit (11) provided with a current mirror circuit (12) connected between one and the other terminals in thermal detection element (6) for detecting a disconnection in wiring between thermal detection element (6) and overheat protective circuit (7). When overheat protective circuit (7) produces an overheat detection signal or when disconnection detection circuit (11) detects a breaking of wiring between thermal detection element (6) and overheat protective circuit (7), the control signal from drive circuit (5) is prohibited to be given to switching element (3). Current mirror circuit (12) in disconnection detection circuit (11) can drive an overheat detection element with less amount of electric current to reliably detect the disconnection. In addition, a drive circuit (1) may be formed into a single integrated circuit of switching element (3) and thermal detection element (6), and also, a control device (2) may be formed into another single integrated circuit of overheat protective circuit (7), drive circuit (5) and disconnection detection circuit (11).

Effect of Invention

The load drive apparatus according to the present invention, disconnection detection circuit may produce an output signal to stop a control signal from a drive circuit to a power control element although breaking of wiring occurs between a thermal detection element and an overheat protective circuit, thereby preventing thermal damage to the power control element by overheating.

EXPLANATION OF SYMBOLS (1) . . . A drive circuit, (2) . . . A control circuit, (3) . . . A driving MOS-FET (A switching element), (4) . . . An electric load, (5) . . . A drive circuit, (6) . . . A diode (A thermal detection element), (7) . . . An overheat protective circuit, (8) . . . A comparator, (9) . . . An OR gate, (10) . . . A regulatory transistor, (11) . . . A disconnection detection circuit, (12) . . . A current mirror circuit, (13) . . . A first transistor (A first amplifying element), (14) . . . A constant current source, (15) . . . A voltage source, (16) . . . A resistor, (17) . . . A second transistor (A second amplifying element), (18) . . . An analogue/digital (A/D) converter, (19) . . . A signal inhibitor circuit,

BEST MODE FOR CARRYING OUT THE INVENTION

An embodiment of the load drive apparatus according to the present invention is described hereinafter in connection with FIG. 1 of the drawings, Same symbols are applied to substantially same elements in FIG. 1 as those in FIG. 2 and their explanation is omitted.

Figure 1:
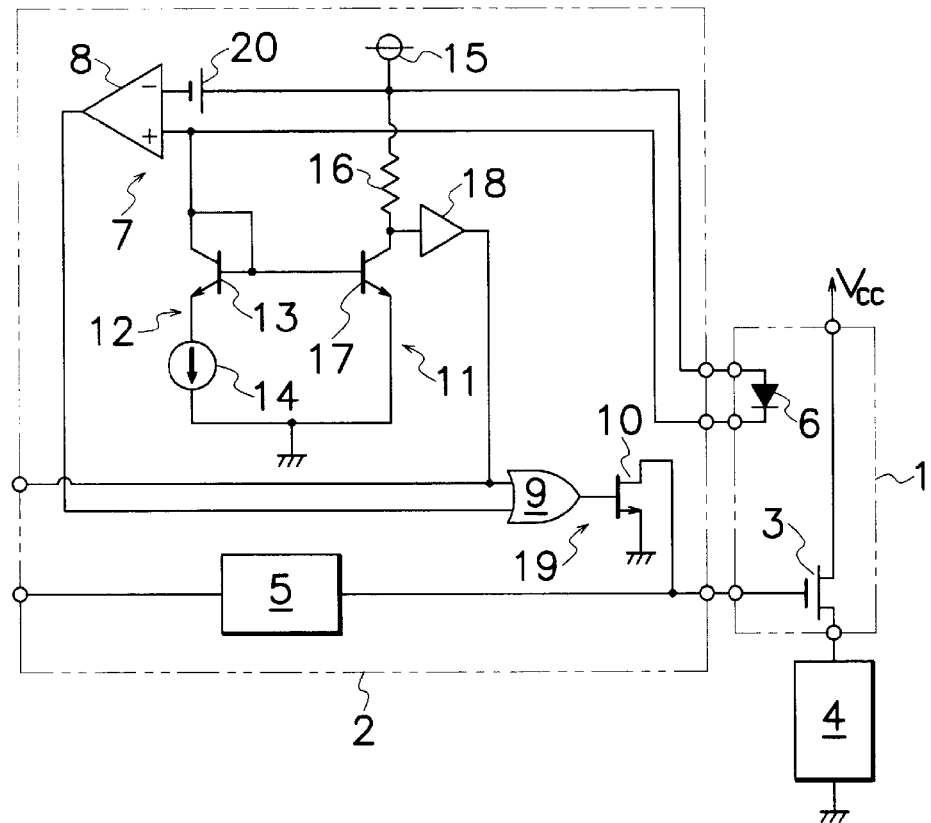
FIG. 1 An electric circuit diagram showing an embodiment of the load drive apparatus according to the present invention.
Figure 2:
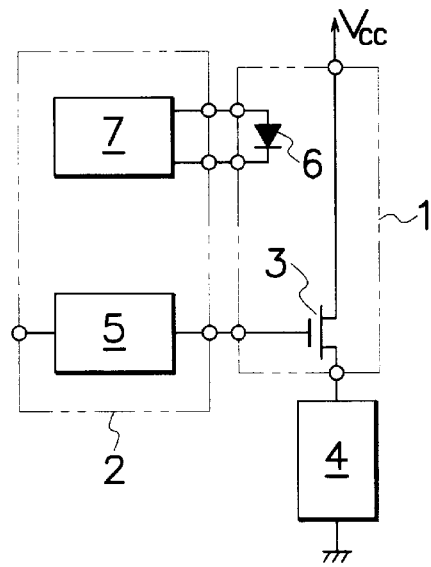
FIG. 2 An electric circuit diagram showing a prior art load drive apparatus.

As shown in FIG. 1, the load drive apparatus according to the present invention comprises a driving MOS-FET 3 as a switching element connected in series to a DC power source $V_{cc}$ and an electric load 4, a drive circuit 5 for generating control signals to turn driving MOS-FET 3 on and off, a temperature-sensitive semiconducting rectifier or temperature detective diode 6 as a thermal detection element for sensing a temperature of driving MOS-FET 3, an overheat protective circuit 7 for generating an overheat detection signal when diode 6 senses the temperature of driving MOS-FET 3 over a predetermined temperature level, a disconnection detection circuit 11 which has a current mirror circuit 12 connected between one and the other terminals in diode 6 for detecting a disconnection in wiring between diode 6 and overheat protective circuit 7, an A/D (analogue/digital) converter 18 connected to current mirror circuit 12, and a signal inhibitor circuit 19 for blocking transmission of control signals from drive circuit 5 to driving MOS-FET 3 when signal inhibitor circuit 19 receives an overheat detection signal from overheat protective circuit 7 or output from A/D converter 18. In the shown embodiment, driving MOS-FET 3 and diode 6 can be formed together into a single integrated circuit, and also, drive circuit 5, overheat protective circuit 7, disconnection detection circuit 11, A/D converter 18 and signal inhibitor circuit 19 can be formed together into another single integrated circuit. In the embodiment shown in FIG. 1, drive circuit 1 and control device 2 are disposed in a spaced relation to each other but electrically connected to each other through wiring or wires.

Disconnection detection circuit 11 comprises a first transistor 13 as a first amplifying element which has a first main or collector terminal connected to one terminal or cathode terminal in diode 6, a constant current source 14 connected between the other main or emitter terminal of first transistor 13 and ground, a second transistor 17 as a second amplifying element which has a main or collector terminal connected to the other or anode terminal of diode 6 and a voltage source 15 through a resistor 16, and an A/D converter 18 which has an input terminal connected between resistor 16 and collector terminal in second transistor 17. Collector and base terminals of first transistor 13 are connected to each other, and base terminal in first transistor 13 is connected to base terminal in second transistor 17 to form a current mirror circuit 12. The other main or emitter terminal of second transistor 17 is connected to ground to detect disconnection in wiring to diode 6 depending on the voltage level applied on collector terminal of second transistor 17.

Overheat protective circuit 7 comprises a comparator 8 which detects a potential difference between voltages applied on cathode and anode terminals of diode 6 wherein cathode terminal in diode 6 is connected to one of two input terminals, namely non-inverted input terminal + of comparator 8, and anode terminal of diode 6 is connected to the other input terminal, namely inverted terminal − of comparator 8 through a reference voltage source 20. A voltage source 15 is connected between resistor 16 and diode 6. Signal inhibitor circuit 19 comprises an OR gate 9 as a logical addition circuit and a regulatory transistor 10 as a regulatory switching element for receiving an output from OR gate 9 to alter voltage level on a gate terminal in driving MOS-FET 3. Upon receiving an output from comparator 8 or A/D converter 18, signal inhibitor circuit 19 stops or prevents a control signal from drive circuit 5 from reaching driving MOS-FET 3. An output from A/D converter 18 can be forwarded to the outside through a connection port of control device 2.

In operation, drive circuit 5 is activated automatically or by a trigger signal from the outside to produce drive signals to gate terminal in driving MOS-FET 3 to turn it on and off. During the on-period of driving MOS-FET 3, electric current is sent from power source $V_{cc}$ through driving MOS-FET 3 to load 4 to activate load 4. In operation of load 4, a forward current flows from power source 15 through diode 6, first transistor 13 and constant current source 14 to ground to cause this forward current to establish a forward voltage on diode 6 and simultaneously to give a current value to constant current source 14. Diode 6 detects the temperature of driving MOS-FET 3 to produce a detection signal to comparator 8 which then compares voltages at inverted and non-inverted input terminals − and +. When driving MOS-FET 3 is heated over a predetermined temperature, internal impedance in diode 6 changes while a potential difference is increased between inverted and non-inverted input terminals − and + in comparator 8 which therefore issues a stop signal given to gate terminal in regulatory transistor 10 through OR gate 9. Consequently, regulatory transistor 10 is turned on to switch driving MOS-FET 3 off because its gate terminal becomes a lower voltage level. When driving MOS-FET 3 is cooled below a predetermined temperature, comparator 8 cancels stop signal to turn regulatory transistor 10 off to return driving MOS-FET 3 to the usual operation that can switch driving MOS-FET 3 on.

Here, assuming that an output voltage value of voltage source 15 is $V_{cc}$ and forward voltage of temperature detecting diode 6 is $V_f$, voltage $V_1$ at non-inverted input terminal + in comparator 8 is equal to voltage $V_a$ at cathode terminal in diode 6 as expressed by the following Equation 1:

$$V_1 = V_a = V_{cc} - V_f \quad \text{(Equation 1)}$$

Also, if a reference voltage of reference voltage source 20 is shown by $V_{ref}$, voltage $V_2$ impressed on inverted input terminal − in comparator 8 is expressed by the following Equation 2:

$$V_2 = V_{cc} - V_{ref} \quad \text{(Equation 2)}$$

Both of forward voltage $V_f$ on diode 6 and voltage $V_1$ at non-inverted input terminal + in comparator 8 have a temperature coefficient of −2 mV/° C. which increases with temperature elevation of diode 6. Accordingly, if drive device 1 is heated to an abnormal temperature level and besides voltage $V_1$ at non-inverted input terminal + in comparator 8 becomes higher than voltage $V_2$ at inverted input terminal −, comparator 8 produces a stop signal to turn regulatory transistor 10 on through OR gate 9 as logical addition circuit so that driving MOS-FET 3 is turned off with its low gate voltage to inhibit electric current from being supplied to load 4.

While diode 6 detects temperature of regulatory transistor 10, a constant electric current flows from voltage source 15 through diode 6, first transistor 13 and constant current source 14 to ground. According to the electric characteristics of current mirror circuit 12, when a first electric current flows through first transistor 13, a second electric current flows from voltage source 15 through resistor 16 and second transistor 17 to ground provided that second electric current has the same value or the proportional multiple of first electric current according to current mirror circuit 12. When electricity is conducted through resistor 16 and collector-emitter terminals in second transistor 17, a voltage drop occurs across resistor 16 to thereby cause voltages at collecter terminal in second transistor 17 and also at input terminal in A/D converter 18 to become a low level. Accordingly, A/D converter 18 produces digital signals of low voltage level to maintain regulatory transistor 10 off through OR gate 9, and so driving MOS-FET 3 is turned on and off to continue to supply electric current to load 4.

When electric disconnection in wiring occurs between diode 16 and comparator 8 due to some reason such as impact, vibration or failure in electrical connection, no electric current flows through constant current source 14 disconnected from voltage source 15. For that reason, electric current flowing through collector and emitter terminals in first transistor 13 comes to zero so that first transistor 13 is turned off under the characteristics of current mirror circuit 12, and simultaneously, second transistor 17 is turned off. Under the condition, no voltage drop arises between both ends of resistor 16, and collecter terminal in second transistor 17 produces a disconnection detection signal and so the input voltage level to A/D converter 18 becomes equal to the output voltage level from voltage source 15. In other words, current mirror circuit 12 can detect no current flow through diode 6. Therefore, A/D converter 18 produces digital signals of high voltage level through OR gate 9 to gate terminal in regulatory transistor 10 which then is turned on to maintain driving MOS-FET 3 off. Digital signals from A/D converter 18 may be forwarded as an alarm signal to the outside through any connection port of control device 2 for remote supervision of the load drive apparatus.

Accordingly, although drive circuit 5 provides drive signals to gate terminal in driving MOS-FET 3, it still remains in the off condition. Thus, the embodiment shown in FIG. 1 can block transmission of control signals from drive circuit 5 to driving MOS-FET 3 by means of overheat detection signal from overheat protective circuit 7 or output from disconnection detection circuit 11 when overheat protective circuit 7 produces an overheat detection signal or when disconnection detection circuit 11 detects breaking of wire between diode 6 and overheat detection circuit 7. Current mirror circuit 12 in disconnection detection circuit 11 ensures positive disconnection detection when overheat detection element can operate with a little amount of electric current. Also, drive device 1 can be formed into a single integrated circuit which incorporates driving MOS-FET 3 and diode 6, and control device 2 can be formed into another single integrated circuit which incorporates overheat protective circuit 7, drive circuit 5 and disconnection detection circuit 11. In this way, the load drive apparatus according to the present invention can prevent a power control element like driving MOS-FET 3 from being subject to thermal damage by overheating.

Embodiments of the present invention may be modified in various ways without limitation to the embodiment shown in FIG. 1. For example, another external voltage source may be used in lieu of voltage source 15 mounted on control device 2 shown in FIG. 1. Operation of drive circuit 5 may be stopped based on a disconnection detection signal from second transistor 17.

APPLICABILITY OF INVENTION IN INDUSTRY

The present invention is applicable to various load drive circuits for detecting, by a thermal detection element, overheat of a switching element which supplies electric power to load, and ceasing operation of the switching element to prevent its overheating when detecting disconnection of wiring to the thermal detection element.

What is claimed is:

1. A load drive apparatus comprising a switching element connected in series to a DC power source and an electric load,
    a drive circuit for generating control signals to turn said switching element on and off,
    a thermal detection element for detecting a temperature of the switching element,
    an overheat protective circuit for generating an overheat detection signal when the thermal detection element detects the temperature of the switching element over a predetermined temperature level, and
    a disconnection detection circuit having a current mirror circuit connected to one and the other terminals in the thermal detection element to detect disconnection in wiring between the thermal detection element and overheat protective circuit by the current mirror circuit,
    wherein the disconnection detection circuit comprises a first amplifying element which has one of its main terminals connected to one of terminals in the thermal detection element, a constant current source connected to the other of its main terminals in the first amplifying element and ground, and a second amplifying element having one of its main terminal connected to the other of the terminals in the thermal detection element and a voltage source through a resistor,
    the one terminal and a control terminal of the first amplifying element are connected to each other,
    the control terminal of the first amplifying element is connected to a control terminal of the second amplifying element,
    the other main terminal of the second amplifying element is connected to ground,
    the level of voltage applied on one terminal of the second amplifying element indicates existence or absence of disconnection in wiring, and
    the overheat protective circuit or disconnection detection circuit produces an output signal to block transmission of control signals from the drive circuit to the switching element when the overheat protective circuit produces the overheat detection signal or when the disconnection detection circuit detects the disconnection in wiring between the thermal detection element and overheat protective circuit.

2. The load drive apparatus of claim 1, further comprising a comparator provided in the overheat protective circuit for detecting a potential difference between voltages applied on one and the other terminals in the thermal detection element,
    an A/D converter connected to the resistor and one of the main terminals of the second amplifying element, and
    a signal inhibitor circuit for blocking transmission of a control signal from the drive circuit to the switching element upon receiving an output from the comparator or from the A/D converter.

3. The load drive apparatus of claim 2, wherein one of the terminals in the thermal detection element is connected to one of the input terminals in the comparator, and
    the other of the terminals in the thermal detection element is connected to the other of the input terminals in the comparator through a reference voltage source.

4. The load drive apparatus of claim 2, wherein the voltage source is connected to a junction of the resistor and thermal detection element.

5. The load drive apparatus of claim 2, wherein the A/D converter within a control device forwards an output signal to the outside of the control device.

* * * * *